United States Patent [19]
Baek

[11] Patent Number: 5,748,032
[45] Date of Patent: May 5, 1998

[54] CHARGE PUMPING CIRCUIT FOR GENERATING A HIGH OUTPUT VOLTAGE

[75] Inventor: Joon-Hyun Baek, Kyungki-Do, Rep. of Korea

[73] Assignee: LG Semicon Co., Ltd., Cheongju, Rep. of Korea

[21] Appl. No.: 581,789

[22] Filed: Jan. 2, 1996

[30] Foreign Application Priority Data

Oct. 25, 1995 [KR] Rep. of Korea ............. 37037/1995

[51] Int. Cl.[6] ............................................... H03K 3/01
[52] U.S. Cl. ............................ 327/536; 363/59; 363/60; 307/110
[58] Field of Search ............................ 327/536, 148, 327/157, 390, 589, 291; 363/59, 60; 331/8, 10, 14, 17; 307/109, 110

[56] References Cited

U.S. PATENT DOCUMENTS

| | | | |
|---|---|---|---|
| 4,574,203 | 3/1986 | Baba | 327/291 |
| 4,760,281 | 7/1988 | Takemae | 327/374 |
| 5,057,707 | 10/1991 | Pigott | 327/536 |
| 5,280,420 | 1/1994 | Rapp | 363/60 |
| 5,367,489 | 11/1994 | Park et al. | 327/536 |
| 5,397,928 | 3/1995 | Chan et al. | 307/109 |
| 5,426,333 | 6/1995 | Maeda | 327/589 |
| 5,532,915 | 7/1996 | Pantelakis et al. | 327/536 |
| 5,546,296 | 8/1996 | Savignac | 327/536 |

FOREIGN PATENT DOCUMENTS 60-74714   4/1985   Japan ............. 327/291

*Primary Examiner*—Timothy P. Callahan
*Assistant Examiner*—Kenneth B. Wells
*Attorney, Agent, or Firm*—Fleshner & Kim

[57] ABSTRACT

A charge pumping circuit allows pumping of the supply voltage in both the positive and negative directions, as a pair of clock signals having inverse phases are inputted. Power consumption is reduced and a high voltage is generated for writing and erasing data in non-volatile digital memories, even when a low voltage is applied.

24 Claims, 4 Drawing Sheets

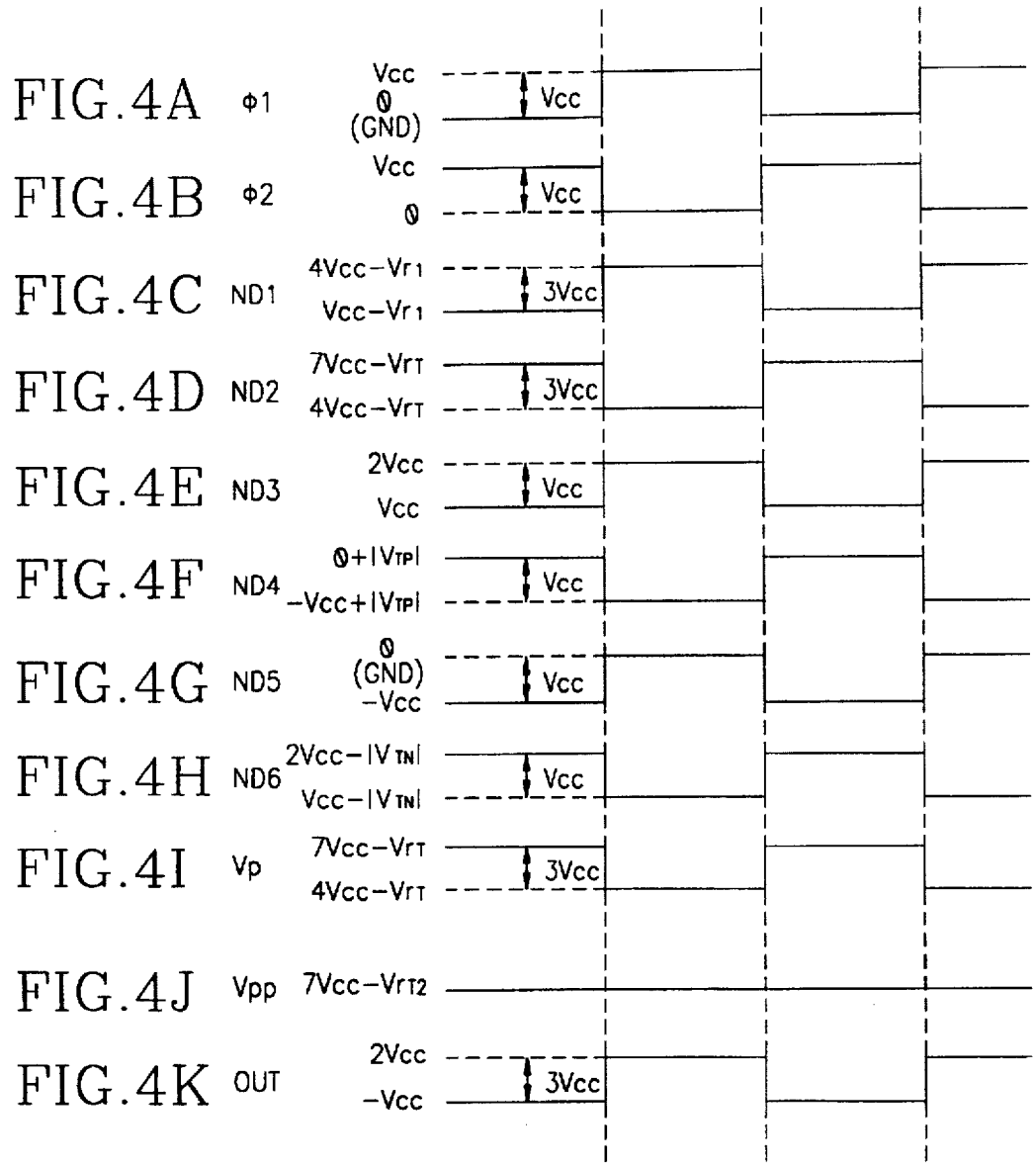
Vr1 = Diode(D1) Cut In Voltage
VrT = Vr1 + Vr2 = D1 Cut In Voltage + D2 Cut In Voltage
VrT2 = Vr1 + Vr2 + Vr3
VTP = Threshold voltage of PMOS
VTN = Threshold voltage of NMOS

CHARGE PUMPING CIRCUIT FOR GENERATING A HIGH OUTPUT VOLTAGE

BACKGROUND OF THE INVENTION

1. Field of the Invention

The present invention relates to a circuit for providing a high voltage to a digital memory, and more particularly, to a charge pumping circuit which minimizes the chip size and operates efficiently even when an externally applied voltage is at a low level, by pumping a supply voltage in the positive and negative directions.

2. Description of the Conventional Art

To write or erase information to or from non-volatile digital memories such as an EEPROM, an EPROM or a flash memory, high voltages between 12V and 20V are required. However, since lower supply voltages between 2V and 5V are supplied to most digital circuits, a charge pumping circuit is required to raise the voltage to high level for non-volatile digital memories.

Referring to FIG. 1, there is shown a conventional charge pumping circuit, including an oscillator 10 for receiving a supply voltage Vcc below 5V and outputting two clock signals $\phi 1$ and $\phi 2$ having inverse phases; an auxiliary pumping unit 20 for outputting a plurality of intermediate voltages by receiving the supply voltage and the two clock signals outputted from the oscillator 10; a buffer unit 30 for outputting two clock signals $\phi 1+$ and $\phi 2+$ having amplitude greater than the two clock signals outputted from the oscillator 10 by using the plurality of intermediate voltages outputted from the auxiliary pumping unit 20; and a main pumping unit 40 for outputting a high voltage Vpp necessary for writing and erasing the information to and from the non-volatile digital memories by increasing the amplitude of the supply voltage using the two clock signals having an increased amplitude which is outputted from the buffer unit 30.

The auxiliary pumping unit 20 includes a plurality of auxiliary pumping terminals $20_1$ to $20_x$ connected in series. The intermediate voltages are outputted respectively from Nodes N1 to NX, which are output terminals of the auxiliary pumping terminals $20_1$ to $20_x$, respectively. The plurality of auxiliary pumping terminals $20_1$ to $20_x$ include diodes DA1 to DAX connected in series; and capacitors CA1 to CAX. Each capacitor has one terminal connected to an anode of a diode and the other terminal connected to one of the two clock signals $\phi 1$ and $\phi 2$ having inverse phases. Further, an external voltage is applied to the anode of the diode DA1 of the auxiliary pumping terminal $20_1$ via a diode DA0. The diode DA0 prevents inverse pumping of the electric potential toward the supply voltage.

The buffer unit 30 includes a plurality of capacitors CB1 to CBY, each having one terminal connected to a corresponding intermediate voltage outputted from a corresponding node N1 to NX of the auxiliary pumping unit 20, and the other terminal grounded for removing ripple elements included in the corresponding intermediate voltage. A plurality of inverters IA1 to IAY inverts and successively amplifies the clock signal $\phi 1$ when the intermediate voltages without the ripple elements, which have been removed by the capacitors CB1 to CBY, are applied, respectively, and finally outputs the clock signal $\phi 1+$ having an increased amplitude. A plurality of inverters IB1 to IBY inverters and successively amplifiers the clock signal $\phi 2$ when the intermediate voltages are applied, and finally outputs the clock signal $\phi 2+$ having an increased amplitude.

The main pumping unit 40 includes a plurality of main pumping terminals $40_1$ to $40_z$ and diode DB0. As the two clock signals $\phi 1+$ and $\phi 2+$ amplified by the buffer unit 30 are inputted, the main pumping unit 40 raises the supply voltage Vcc to the high voltage Vpp necessary for the digital memory.

The operations of the conventional charge pumping circuit will be explained, in detail.

When the supply voltage is applied and the oscillator 10 outputs the two clock signals $\phi 1$ and $\phi 2$ having inverse phases, each capacitor CA1 to CAX of the auxiliary pumping unit 20 is repeatedly charged and discharged. When the clock signal $\phi 1$ applied to one terminal is low level, the capacitor CA1 is charged by the external voltage applied to the other terminal via the diode DA0. When the polarities of the clock signals $\phi 1$ and $\phi 2$ are changed, the electric potential charged in the capacitor CA1 is transmitted to the capacitor CA2 via the diode DA1. Through the above described courses, the intermediate voltages applied to the nodes N1 to NX are successively increased, and the voltage is increased by $\Delta V$ at each auxiliary pumping terminal $20_1$ to $20_x$. For example, the voltage at the node N1 becomes Vcc+$\Delta$, and the voltage at the node N2 is Vcc+2$\Delta$. Similarly, the voltage of the node NX is Vcc+x$\Delta$. As shown above, the amplitude of the intermediate voltages applied to the nodes N1 to NX is larger than the amplitude of the supply voltage, and those intermediate voltages are outputted to the buffer unit 30 to drive the inverters IA1 to IAY and IB1 to IBY.

The respective amplitudes in the buffer unit 30 are increased when the two clock signals having different phases outputted from the oscillator 10 pass through the serially connected inverters IA1 to IAY and IB1 to IBY. When the clock signal $\phi 1$ is applied to the inverter IA1 and the clock signal $\phi 2$ is applied to the inverter IB1, the inverters IA1 and IB2, each driven by the intermediate voltage at the node N1 invert and amplify the clock signals $\phi 1$ and $\phi 2$, respectively, and output the signals $\phi 1+$ and $\phi 2+$. Similarly, the inverters IA2 and IB2 driven by the intermediate voltage at the node N2 and the inverters IAY and IBY driven by the intermediate voltage at the node NX invert and amplify the clock signals, and output the signals $\phi 1+$ and $\phi 2+$ having an increased amplitude, respectively.

Afterwards, as the amplified clock signals $\phi 1+$ and $\phi 2+$ inputted from the buffer unit 30 are outputted to the plurality of main pumping terminals $40_1$ to $40_z$, the main pumping unit 40 outputs the high voltage Vpp by amplifying the supply voltage, as in the case of the auxiliary pumping unit 20.

However, the conventional charge pumping circuit has a problem in that the overall size is large due to an auxiliary pumping unit and a buffer unit between the main pumping unit and the oscillator, oscillator. Further, electric power is wasted for driving the auxiliary pumping unit and the buffer unit. Further, the pump efficiency is decreased since the threshold voltages of the diodes increase as the number of pumping terminals connected in series increases.

Accordingly, when the supply voltage Vcc is below 2V, it is difficult to obtain the required high voltage Vpp since the voltage pumped from each pumping terminal is small.

SUMMARY OF THE INVENTION

Therefore, it is an object of the present invention to provide a charge pumping circuit capable of pumping the supply voltage in both the positive and negative directions and reducing the number of pumping terminals connected in series, thereby the electric power consumption is reduced and a high voltage Vpp can be obtained even at a low supply voltage, e.g., below 2V.

To achieve the above-described object, the charge pumping circuit according to the present invention includes a supply voltage; at least one clock booster means for amplifying the supply voltage in the positive direction and to a first predetermined level and negative direction to a second to a predetermined level, when a pair of clock signals having inverse phases are inputted; and at least one pumping means for amplifying the applied supply voltage to a predetermined level when the output voltage of at least one clock booster means is inputted.

In the charge pumping circuit having the above-described construction, when the first clock signal is high level, the clock booster means pumps the supply voltage at twice the original magnitude in the positive direction. Whereas, when the first clock signal is low level, the clock booster means pumps the supply voltage once the original magnitude in the negative direction, thereby outputting them to the pumping unit. Since the supply voltage is pumped again by the voltage outputted from the clock booster means, the voltage of high electric potential is outputted to the pumping unit.

BRIEF DESCRIPTION OF THE DRAWINGS

The above object and advantages of the present invention will be more clearly understood from the following detailed description taken in conjunction with the accompanying drawings, in which:

FIGS. 4A-4K are timing diagrams illustrating the operation of the clock booster 60 or 70 of FIG. 3.

DETAILED DESCRIPTION OF THE PREFERRED EMBODIMENTS

Figure 1:
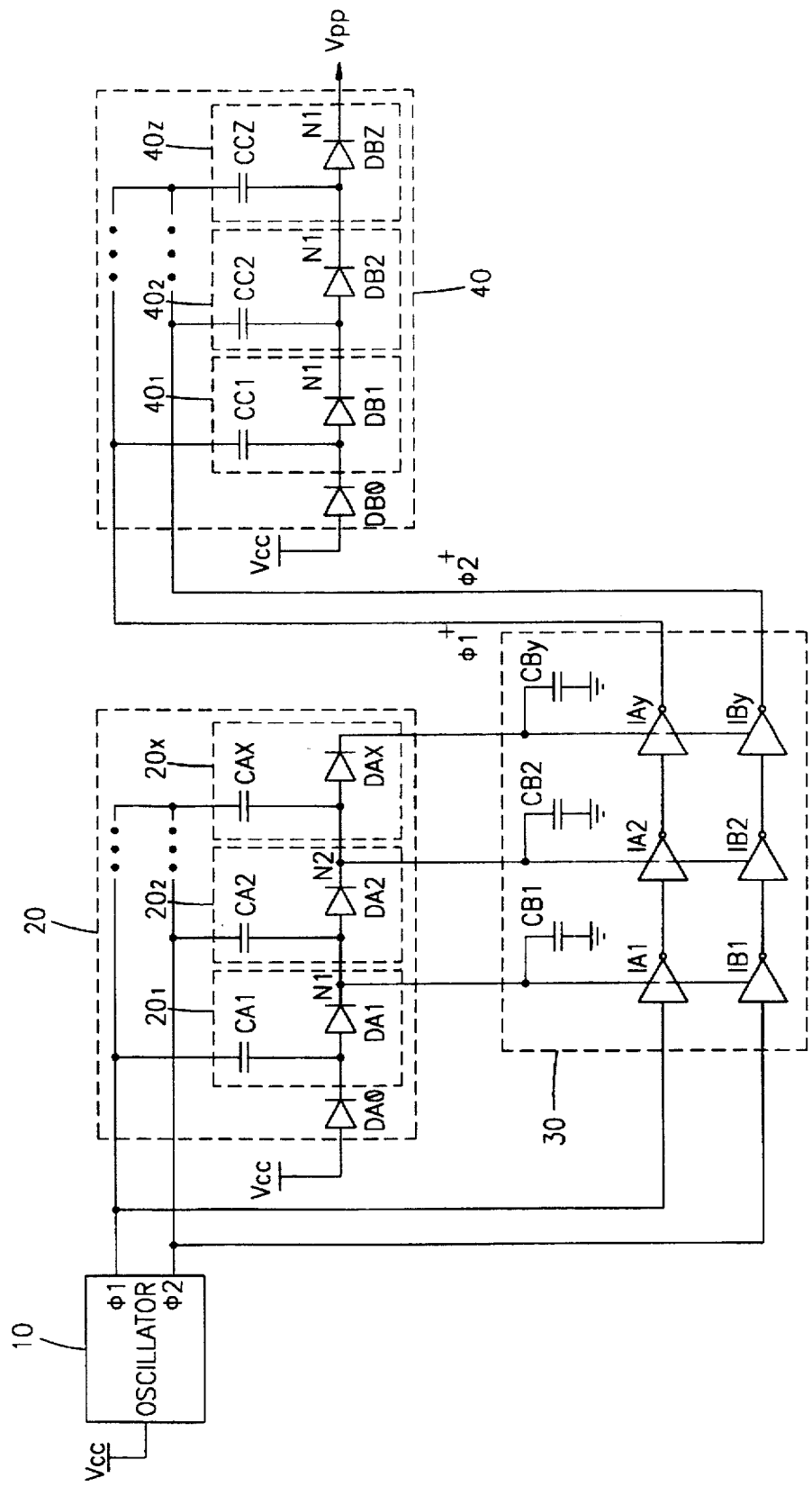
FIG. 1 shows a construction of a conventional charge pumping circuit.
Figure 2:
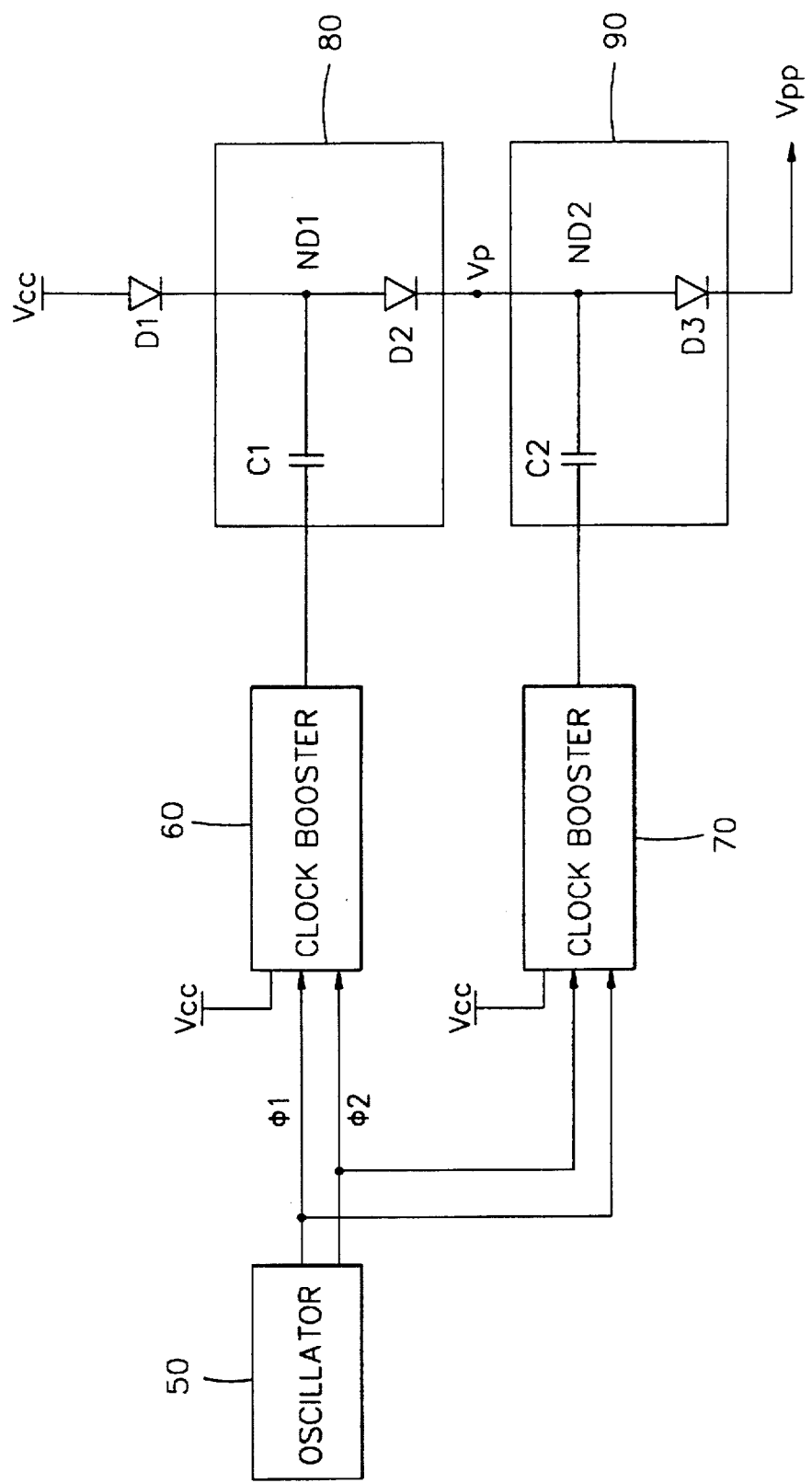
FIG. 2 shows a construction of a charge pumping circuit according to the present invention.

Referring to FIG. 2, the charge pumping circuit according to the present invention includes an oscillator 50 for outputting two clock signals $\phi1$ and $\phi2$ having inverse phases as the supply voltage Vcc is applied; clock boosters 60 and 70 for pumping the supply voltage at twice the original magnitude in the positive direction and pumping the supply voltage at the original magnitude in the negative direction by receiving the two clock signals $\phi1$ and $\phi2$ and the supply voltage, and outputting the raised supply voltages; a pumping unit 80 for pumping the voltage applied from the outside via a diode D1 as the signal outputted from the clock booster 60 is applied; and a pumping unit 90 for pumping the signal outputted from the pumping unit 80 as the signal outputted from the clock booster 70 is applied. Here, the pumping unit 80 includes a capacitor C1 and a diode D2, and the pumping unit 90 includes a capacitor C2 and a diode D3, respectively, as in the cases of the auxiliary pumping terminals $20_1$ to $20_x$ and the main pumping terminals $40_1$ to $40_z$.

Figure 3:
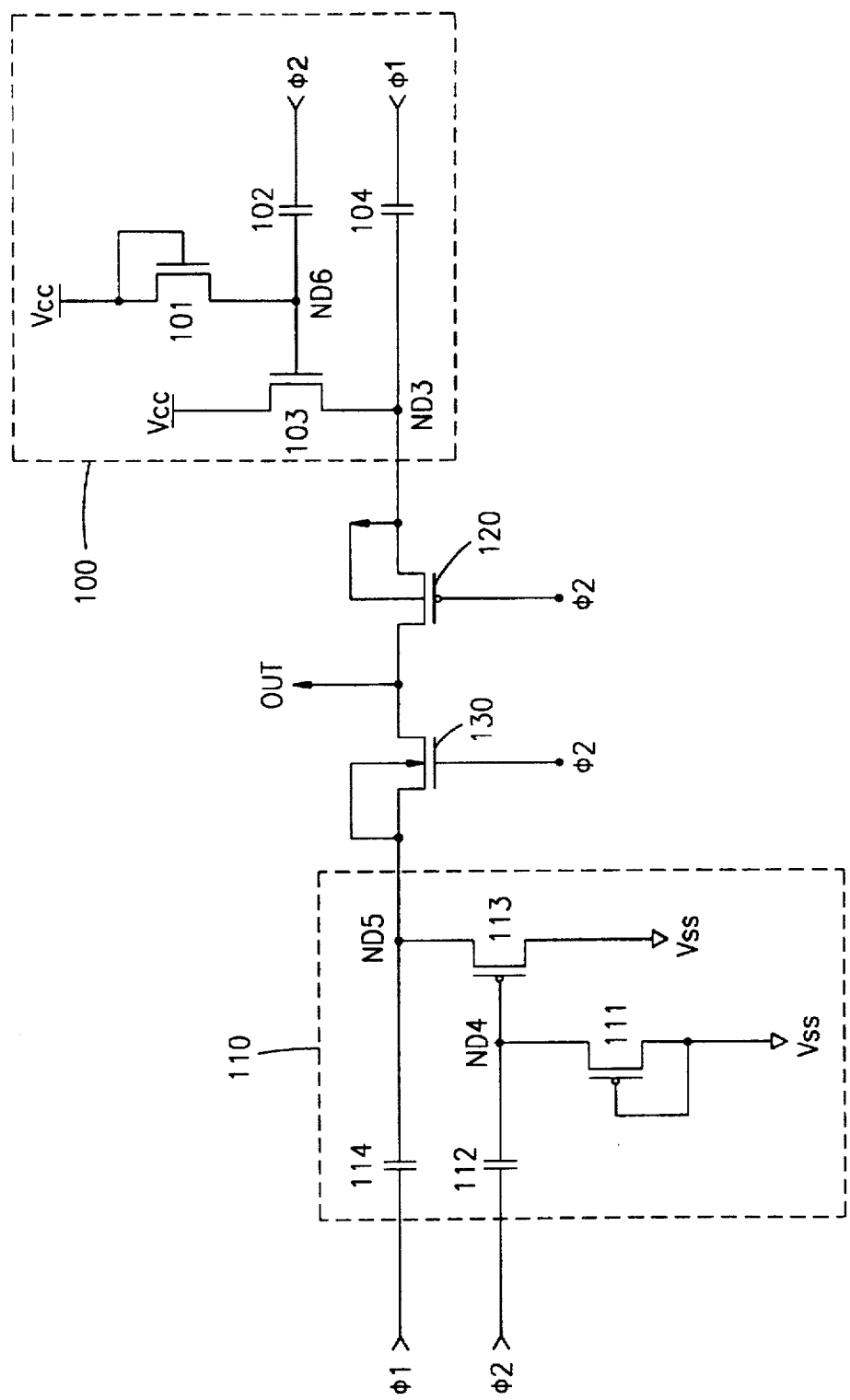
FIG. 3 shows a construction of a clock booster in FIG. 2.

Each clock booster 60 and 70, as shown in FIG. 3, includes a positive direction pumping unit 100 for pumping the supply voltage Vcc at twice the original magnitude in the positive direction, as the clock signals $\phi1$ and $\phi2$ are applied; a negative direction pumping unit 110 for pumping the voltage of ground level in the negative direction, as the clock signals $\phi1$ and $\phi2$ are applied; a PMOS transistor 120 acting as a switching means for transmitting the voltage outputted from the positive direction pumping unit 100 to the drain of the PMOS transistor 120 when the clock signal $\phi2$ of a low level is applied to the gate, which is connected to the source of the PMOS transistor 120, and an NMOS transistor 130 acting as a switching means for transmitting the voltage outputted from the negative direction pumping unit 110 to the source of NMOS transistor 130 when the clock signal $\phi2$ of a high level is applied to the gate, which is connected to the drain, of the NMOS transistor 130.

The positive direction pumping unit 100 includes an NMOS transistor 101 for outputting the supply voltage to a source of the NMOS transistor 101, as the supply voltage is commonly applied to a drain and a gate; a capacitor 102 for pumping the voltage applied to one terminal from the source of the NMOS transistor 101 in the positive direction in accordance with the clock signal $\phi2$ applied to the other terminal; an NMOS transistor 103 for transmitting the supply voltage applied to a drain to a source of the NMOS transistor 103, i.e., node ND3, as the voltage outputted from the source of the NMOS transistor 101 is pumped by the capacitor 102 and applied to a gate of the NMOS transistor 103; and a capacitor 104 for pumping the voltage of the node ND3 in the positive direction, as the clock signal $\phi1$ is applied to one terminal and the voltage of the node ND3 outputted from the source of the NMOS transistor 103 is applied to the other terminal.

The negative direction pumping unit 110 includes a PMOS transistor 111 having a drain and a gate which are commonly connected to ground and having a source with a potential of the node ND4, made to be at ground level; a capacitor 112 responsive to the clock signal $\phi2$ applied to one terminal for pumping in the negative direction the voltage of the node ND4 applied to the other terminal; a PMOS transistor 113 having a gate to which the voltage of the node ND4 pumped by as much as the magnitude of the supply voltage in the negative direction is applied, having a drain which is connected to ground, and thus having a source with a potential of the node ND5, made to be at ground level; and a capacitor 114 responsive to the clock signal $\phi1$ applied to one terminal for pumping in the negative direction the potential of a ground level at the node ND5 applied to the other terminal by as much as the magnitude of the supply voltage.

The operations of the charge pumping circuit having the above construction will be explained as follows.

If the supply voltage Vcc is applied to the charge pumping circuit according to the present invention, the oscillator 50 outputs the two clock signals $\phi1$ and $\phi2$ having a voltage between 0V and Vcc and having inverse phases to the clock boosters 60 and 70, respectively. The clock boosters 60 and 70 pump the supply voltage Vcc at twice the original magnitude in the positive direction and pump the supply voltage Vcc once the original magnitude in the negative direction, and output them to the capacitors C1 and C2, respectively. The voltages pumped in the clock boosters 60 and 70 are inputted to the pumping units 80 and 90, respectively. In the pumping unit 80, the voltage pumped at the clock booster 60 is applied to one terminal of the capacitor C1, and the supply voltage applied from the outside via the diode D1 is applied to the other terminal of the capacitor C1 via the node ND1, thereby allowing the capacitor C1 to pump the supply voltage. Accordingly, the voltage of node ND1 is pumped at a greater magnitude in comparison with the original supply voltage and outputted to the node ND2 of the pumping unit 90. In the pumping unit 90, the signal pumped in the clock booster 70 is applied to one terminal of the capacitor C2, and the voltage outputted from the pumping unit 80 is applied to the other terminal via the node ND2, thereby the capacitor C2 pumps the output voltage of the pumping unit 80. Accordingly, the voltage of the node ND2 is pumped at a greater magnitude in comparison with the voltage outputted from the pumping unit 80, and outputted via the diode D3, thereby it is used as the high voltage Vpp necessary for writing and erasing the data in non-volatile digital memories.

Here, referring to FIGS. 3 and 4A–4K, the detailed operations of the clock boosters 60 and 70 will be explained. When the clock signal φ1 a low level, the clock signal φ2 becomes high. At this time, assuming that the supply voltage is commonly applied to the drain and the gate of the NMOS transistor 101 of the positive direction pumping unit 100, the NMOS transistor 101 outputs to the source the voltage obtained by subtracting the threshold voltage from the applied supply voltage. The capacitor 102 pumps the voltage outputted from the source of the NMOS transistor 101 in the positive direction, as the clock signal φ2 outputted from the oscillator 50 is applied to one terminal and the voltage outputted from the source of the NMOS transistor 101 is applied to the other terminal. The NMOS transistor 103 transmits the supply voltage applied to the drain to the source, i.e., node ND3 without loss, as the voltage pumped by the capacitor 102 is applied to the gate. As shown above, when the clock signal φ1 is low and the clock signal φ2 is high, the supply voltage Vcc is applied to the node ND3, i.e., the output terminal of the positive direction pumping unit 100.

Afterwards, when the clock signal φ1 having a voltage between 0V and Vcc becomes high and the clock signal φ2 becomes low, the capacitor 104 of the positive direction pumping unit 100 pumps the voltage of the node ND3 amplified to the level of the supply voltage at the former state at twice the original magnitude of the supply voltage in the positive direction, by using the clock signal φ1. Further, as the clock signal φ2 of low level is applied, the switching means, i.e., the PMOS transistor 120 is turned on. Accordingly, the voltage of the node ND3 pumped at twice the magnitude of the supply voltage by the capacitor 104 is transmitted to the output terminal OUT via the PMOS transistor 120, which is turned on. At this time, the voltage at the node ND5 of the negative direction pumping unit 110 is explained as follows.

Since the clock signal φ1 at a high level and the clock signal φ2 at a low level, the capacitor 112 having one terminal to which the clock signal φ2 of low level is applied pumps in the negative direction the electric potential lowered to the ground level by the PMOS transistor 111. Therefore, the PMOS transistor 113 is turned on, and the potential of the node ND5 becomes a ground level. However, the voltage outputted from the negative direction pumping unit 110 is not transmitted to the output terminal OUT by the NMOS transistor 130 which is turned off when the clock signal φ2 of low level is applied to a gate. Accordingly, the voltage of the output terminal OUT is maintained at 2Vcc, i.e., the voltage outputted from the positive direction pumping unit 100.

On the other hand, when the clock signal φ1 of high level becomes low, the other clock signal φ2 becomes high. At this time, the capacitor 114 of the negative direction pumping unit 110 pumps the potential of the node ND5 lowered to the ground level in the former stage once at the negative direction, by using the clock signal φ1 of low level. The potential at the node ND5 pumped in the negative direction is transmitted to the output terminal OUT by the NMOS transistor 130, which is turned on when the clock signal φ2 of high level is applied to a gate. At this time, the potential of the positive direction pumping unit 100 is not transmitted to the output terminal OUT by the PMOS transistor 120, which is turned off by the clock signal φ2 of high level applied to its gate. Accordingly, the output signal of the negative direction pumping unit 110 pumped in the negative direction is applied to the output terminal OUT. As shown above, when the clock signal having a voltage between 0V and Vcc and the supply voltage are inputted to the clock boosters 60 and 70, the signal having a voltage between −Vcc and 2Vcc is generated, a the signal pumped three times larger than the supply voltage is generated. The signals pumped in the clock boosters 60 and 70 are applied to the pumping units 80 and 90, respectively, and the pumping units 80 and 90 pump the supply voltage by using the signals pumped at the clock boosters 60 and 70, thereby finally outputting the high voltage Vpp necessary for writing and erasing the data in non-volatile digital memories.

The NMOS transistors and PMOS transistors of FIG. 3 all require bulk bias, and this problem can be easily solved with triple well structures. Further, for solving the latch-up problem in the MOS transistors 120 and 130 which are used as switching means, a skew is provided to the clock signal.

As shown above, the charge pumping circuit according to the present invention reduces the amount of required space and time by pumping the supply voltage in the positive and negative directions and by decreasing the number of pumping units. Additionally, the charge pumping circuit of the present invention has the advantage in that pumping operation is easily performed even if the voltage Vcc applied from the outside is a low voltage, such as 2V.

What is claimed is:

1. A charge pumping circuit comprising:
    a) a first clock booster means, responsive to first and second clock signals, for changing a first voltage in a positive direction to a first predetermined level and for changing a second voltage in a negative direction to a second predetermined level such that a difference in magnitude of the first and second predetermined levels is greater than a difference in magnitude of the first and second voltages, wherein said first clock booster means includes
        i) a first positive direction pumping means for changing the first voltage in the positive direction to the first predetermined level in response to said first and second clock signals,
        ii) a first negative direction pumping means for changing the second voltage in the negative direction to the second predetermined level in response to the first and second clock signals, and
        iii) first switching means, coupled to said first positive and negative direction pumping means, for switching an output signal at an output terminal of said first clock booster means between the first and second predetermined levels in response to the second clock signal; and
    b) a first pumping means, coupled for receiving the first voltage, for amplifying the first voltage to a third predetermined voltage level in response to one of the first and second predetermined levels outputted as the output signal at the output terminal of said first clock booster means.

2. The circuit of claim 1, wherein said switching means comprises:
    a first switching means for switching the output signal at the output terminal to the first predetermined level when the second clock signal transits from the first voltage to the second voltage; and a second switching means for switching the output signal at the output terminal to the second predetermined level when the second clock signal transits from the second voltage to the first voltage.

3. The circuit of claim 1, wherein said first positive direction pumping means includes:
   a first transistor for outputting the first voltage, commonly applied to a drain and a gate of said first transistor, to a source of said first transistor;
   a first capacitor for pumping the first voltage applied to one terminal from the source of said first transistor in the positive direction, when said second clock signal is at the first voltage;
   a second transistor for transmitting the first voltage applied to a drain of said second transistor to a source thereof, as the first voltage pumped by said first capacitor is applied to a gate of said second transistor; and
   a second capacitor for pumping the first voltage outputted from the source of said second transistor to a first predetermined level, as said first clock signal is at said first voltage.

4. The circuit of claim 3, wherein said first and second transistors are NMOS transistors.

5. The circuit of claim 3, wherein said first and second capacitors are NMOS capacitors.

6. The circuit of claim 1, wherein said first negative direction pumping means includes:
   a third transistor having a drain and a gate which are commonly connected to a ground potential and having a source with a first potential made to be at ground level;
   a third capacitor for pumping the first potential outputted from the source of said third transistor in the negative direction, when said second clock signal is at the first voltage,
   a fourth transistor having a gate to which the first potential pumped by said third capacitor is applied, and having a source with a second potential made to be at ground level; and
   a fourth capacitor for pumping the second potential outputted from the source of said fourth transistor in the negative direction, when said first clock signal is at the second voltage.

7. The circuit of claim 6, wherein said third and fourth transistors are PMOS transistors.

8. The circuit of claim 6, wherein said third and fourth capacitors are PMOS capacitors.

9. The circuit of claim 2, wherein said first and second switching means are turned on and turned off, alternately, according to said second clock signal.

10. The circuit of claim 9, wherein said first switching means is turned on when said second clock signal is a low level.

11. The circuit of claim 10, wherein said first switching means is a PMOS transistor.

12. The circuit of claim 9, wherein said second switching means is turned on when said second clock signal is a high level.

13. The circuit of claim 12, wherein said second switching means is an NMOS transistor.

14. The circuit of claim 1, wherein said first pumping means includes:
   a first diode for transmitting the first voltage applied to its anode in one direction and a cathode coupled to a first node;
   a second diode having an anode coupled to the first node; and
   a capacitor having one terminal connected to said first clock booster means and another terminal connected to the first node for pumping the first voltage by being charged and discharged alternately responsive to the output signal from said first clock booster means such that an increased potential is outputted at a cathode of said second diode.

15. The circuit of claim 1, wherein said first and second clock signals have opposite phases.

16. The circuit of claim 1 further comprising
   a second clock booster means, responsive to the first and second clock signals, for changing the first voltage in the positive direction to the first predetermined level and for changing the second voltage in the negative direction to the second predetermined level such that the difference in magnitude of the first and second predetermined levels is greater than the difference in magnitude of the first and second voltages; and
   a second pumping means for amplifying an output of said first pumping means to a fourth predetermined voltage level in response to one of the first and second predetermined levels of said second clock booster means.

17. The circuit of claim 16, wherein said second clock booster means includes
   i) a second positive direction pumping means for changing the first voltage in the positive direction to the first predetermined level in response to said first and second clock signals,
   ii) a second negative direction pumping means for changing the second voltage in the negative direction to the second predetermined level in response to the first and second clock signals, and
   iii) second switching means, coupled to said second positive and negative direction pumping means, for switching a second output signal at a second output terminal of said second clock booster means between the first and second predetermined levels in response to the second clock signal.

18. A circuit for generating first and second output signals in response to first and second clock signals, comprising:
   i) a first pumping circuit for increasing a magnitude of a first predetermined potential at a first node to a first predetermined level in response to the first and second clock signals;
   ii) a second pumping circuit for increasing a magnitude of a second predetermined potential at a second node to a second predetermined level in response to the first and second clock signals; and
   iii) a switching circuit, coupled to said first and second pumping circuit at the first and second nodes, respectively, for switching an output signal at an output terminal between the first and second predetermined levels in response to the second clock signal.

19. The circuit of claim 18, wherein said switching circuit comprises:
   a first switch coupled to the output terminal and the first node of said first pumping circuit such that the first predetermined level is provided as the output signal of the output terminal when the second clock signal transits from a first state to a second state; and
   a second switch coupled to the output terminal and the second node of said second pumping circuit such that the second predetermined level is provided as the output signal of the output terminal when the second clock signal transits from the second state to the first state.

20. The circuit of claim 18, wherein the first and second clock signals have opposite phases.

21. The circuit of claim 18, wherein said first pumping circuit comprises:
   a first capacitor coupled to receive the second clock signal and coupled to a third node;
   a first transistor coupled to the first predetermined potential and the third node;
   a second transistor coupled to the first predetermined potential, the third node and said switching circuit; and
   a second capacitor coupled to receive the first clock signal and said switching circuit.

22. The circuit of claim 21, wherein said first and second transistors are NMOS transistors and the first predetermined potential is a source potential.

23. The circuit of claim 18, wherein said second pumping circuit comprises:
   a third capacitor coupled to receive the second clock signal and coupled to a fourth node;
   a third transistor coupled to the second predetermined potential and the fourth node;
   a fourth transistor coupled to the second predetermined potential, the fourth node and said switching circuit; and
   a fourth capacitor coupled to receive the first clock signal and said switching circuit.

24. The circuit of claim 23, wherein said third and fourth transistors are PMOS transistors and the second predetermined potential is a ground potential.

* * * * *